(12) United States Patent
Tomita

(10) Patent No.: US 6,882,576 B2
(45) Date of Patent: Apr. 19, 2005

(54) SEMICONDUCTOR MEMORY DEVICE

(75) Inventor: Hidemoto Tomita, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 117 days.

(21) Appl. No.: 10/615,173

(22) Filed: Jul. 9, 2003

(65) Prior Publication Data

US 2004/0141403 A1 Jul. 22, 2004

(30) Foreign Application Priority Data

Jan. 16, 2003 (JP) .................................... P2003-007945

(51) Int. Cl.$^7$ ............................................. G11C 11/34
(52) U.S. Cl. ........................ 365/188; 365/177; 365/72
(58) Field of Search ................. 365/188, 177, 365/72; 257/E27.098

(56) References Cited

U.S. PATENT DOCUMENTS 5,541,427 A    7/1996  Chappell et al.
5,732,023 A  * 3/1998  Roberts ...................... 365/188
5,744,844 A    4/1998  Higuchi
5,930,163 A    7/1999  Hara et al.

FOREIGN PATENT DOCUMENTS

JP    9-270468    10/1997
JP    10-178110    6/1998

* cited by examiner

Primary Examiner—David Lam
(74) Attorney, Agent, or Firm—McDermott Will & Emery LLP

(57) ABSTRACT

A semiconductor memory device includes a memory cell array in which memory cells each having six transistors 11a, 11b, 12a, 12b, 13a and 13b are arranged two-dimensionally on a semiconductor substrate. The semiconductor memory device also includes a plurality of word lines connected to each of the memory cells, and arranged on a parallel to each other along a first direction, a plurality of bit lines connected to each of the memory cells and arranged on a parallel to each other along a second direction perpendicular to the first direction, and at least two gate electrodes provided on the semiconductor substrate such that each of the gate electrodes is connected to at least one transistor of the six transistors, all of the gate electrodes 3a, 3b, 3c and 3d being arranged on the same straight line parallel to the first direction.

6 Claims, 8 Drawing Sheets

SEMICONDUCTOR MEMORY DEVICE

BACKGROUND OF THE INVENTION

1. Field of the Invention

The present invention relates to a semiconductor memory device and more specifically, relates to an SRAM.

2. Description of the Background Art

According to the SRAM, since it is not necessary to perform refreshing operation in an on state, the SRAM is easy to use but there are many elements in one memory cell and its occupied area is large. Then, reduction in the cell area has been required. According to the conventional SRAM, there is an example of a layout of a cell in which a word line is longer than a bit line, as disclosed in Japanese Laid-open Patent Publication No. 9-270468 (corresponding U.S. Pat. No. 5,744,844) and Japanese Laid-open Patent Publication No. 10-178110 (corresponding U.S. Pat. No. 5,930,163). Thus, speeding up is implemented and a cell area is reduced by reducing the length in the bit line direction.

Furthermore, with respect to miniaturization, a phenomenon of distortion of resist pattern on a wafer (optical proximity effect) becomes quite noticeable because of optical interference in a photolithography machine. In addition, with respect to the process of etching, there is generated pattern distortion after etching caused by a micro loading effect. The micro loading effect is a phenomenon in which as patterns having large difference in density are matched, an etching rate is lowered in a depth direction. In recent years, in order to make such pattern distortion minimum, an optical proximity correction (OPC) technique which previously and automatically corrects a mask pattern in the process of photolithography by a CAD technique has been developed and used.

According to the SRAM, it is necessary to take out data from each memory cell through a bit line at high speed. The data is output from each memory cell through a bit line, an I/O line, a sense amplifier, a read data bus, and an output buffer. At this time, when a signal level output on the bit line from the memory cell is 0.1V, a signal level output on the I/O line through the bit line is about 0.05V, which becomes very small. Therefore, it is likely to receive an influence of noise, and a sense amplifier with high precision is needed in order to amplify it to a Vdd level of about 1.8V.

SUMMARY OF THE INVENTION

It is an object of the present invention to prevent a signal level from lowering on a bit line in a semiconductor memory device, particularly, in an SRAM.

In accordance with one aspect of the present invention, there is provided a semiconductor memory device including a memory cell array in which memory cells each having six transistors are arranged two-dimensionally on a semiconductor substrate. The semiconductor memory device also includes a plurality of word lines connected to each of the memory cells, and arranged on a parallel to each other along a first direction, a plurality of bit lines connected to each of the memory cells and arranged on a parallel to each other along a second direction perpendicular to the first direction, and at least two gate electrodes provided on the semiconductor substrate such that each of the gate electrodes is connected to at least one transistor of the six transistors, all of the gate electrodes being arranged on the same straight line parallel to the first direction.

BRIEF DESCRIPTION OF THE DRAWINGS

The present invention will become readily understood from the following description of preferred embodiments thereof made with reference to the accompanying drawings, in which like parts are designated by like reference numeral, and in which.

DESCRIPTION OF THE PREFERRED EMBODIMENTS

Figure 1:
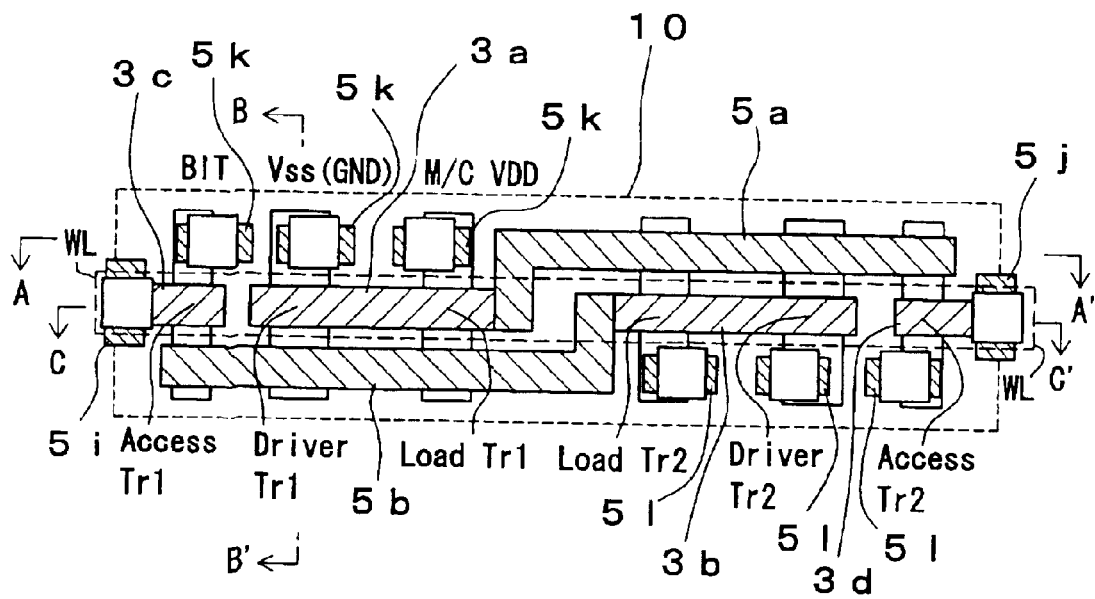
FIG. 1 is a plane view of a structure of gate electrodes of a semiconductor memory device according to a first embodiment of the present invention.

A semiconductor memory device and a method of manufacturing the same according to preferred embodiments will be described with reference to accompanying drawings. In addition, the same reference numerals are allotted to the substantially same components in the drawings.

(Embodiment 1)

Figure 2:
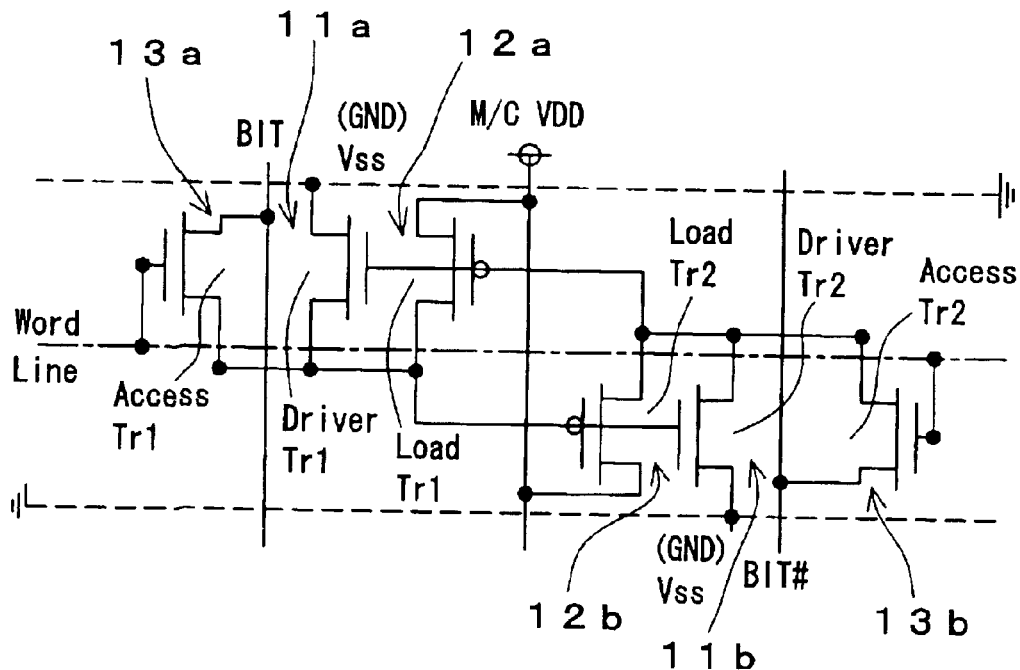
FIG. 2 is a circuit diagram of an equivalent circuit corresponding to one memory cell of the semiconductor memory device according to the first embodiment of the present invention.

A semiconductor memory device and a method of manufacturing the same according to a first embodiment of the present invention will be described with reference to FIGS. 1 to 11. First, an arrangement of gate electrode in the semiconductor memory device will be described with reference to FIGS. 1 and 2. FIG. 1 is a plane view of a projective arrangement of the gate electrode connected to six transistors and local inter-connectors in a single memory cell. FIG. 2 is an equivalent circuit diagram of the semiconductor memory device.

The semiconductor memory device includes a memory cell array in which memory cells each having six transistors are arranged two-dimensionally. The memory cell includes two sets of driver transistors 11a and 11b, load transistors 12a and 12b, and access transistors 13a and 13b. As an example of the semiconductor memory device, there is an SRAM which has six transistors in one memory cell. A gate electrode in one memory cell 10 will be described. The memory cell 10 includes two kinds of gate electrode. More specifically, a first gate electrode 3a and a second gate electrode 3b which connect the driver transistors 11a and 11b to the load transistors 12a and 12b, and a third gate electrode 3c and a fourth gate electrode 3d which connect the access transistors 13a and 13b to a word line WL. The fist, second, third and fourth gate electrode 3a, 3b, 3c and 3d are arranged on the same straight line parallel with the word line WL (shown by a dotted line) in its longitudinal direction. Thus, a length of the memory cell in the direction of a bit line vertical to the word line WL can be reduced. As a result, wiring capacitance and wiring resistance of the bit line can be reduced, which speeds up reading and writing. Particularly, in reading data, data is output from each memory cell though a bit line, an I/O line, a sense amplifier, a read data bus and an output buffer. At this time, since the length of the bit line can be reduced, a signal level when reached the I/O line through the bit line is prevented from lowering as compared with a signal level taken out of the memory cell to the bit line. Thus, an output from the memory cell can be extremely increased and a circuit configuration employing the sense amplifier system can correspond to high speed.

In addition, each of the gate electrodes 3a, 3b, 3c and 3d has a rectangular configuration having sides of straight lines with no notched portion nor projection. Therefore, since the gate electrodes 3a, 3b, 3c and 3d can be formed with high precision, each transistor characteristic can be stabilized. As a result, as-the semiconductor memory device, stable characteristics can be provided. Furthermore, since all of the gate electrodes in the memory cell are arranged on the straight line, an unnecessary area can be reduced. Furthermore, the number of contact holes and via holes in the cell plane can be reduced, so that the cell area can be reduced. In addition, the word line in the longitudinal direction is referred to as a first direction and the direction runs at right angles to the first direction is referred to as a second direction. It should be noted that the third electrode 3c, the first electrode 3a, the second electrode 3b, and the fourth electrode 3d are respectively arranged from the one end of the straight line to the other end of the straight line.

Moreover, in this semiconductor memory device, each of the gate electrodes is in contact through a local inter-connector (LIC) described in U.S. Pat. No. 5,541,427. More specifically, each of the gate electrodes is connected not through a via hole formed directly in the gate electrode but through the local inter-connector (LIC) formed of tungsten using damascene process. Since the LIC is used, it is not necessary to provide a cover margin for connection when each of the gate electrode is formed and the rectangular gate electrode having sides of straight line with no notched portion nor projection can be laid out. Furthermore, since the first, second, third and fourth gate electrodes 3a, 3b, 3c and 3d are laid out on the same straight line, pattern distortion caused by interference can be prevented at a step of forming the gate electrode by photolithography. Thus, an optical proximity effect in the photolithography can be prevented. As a result, the gate electrode can be miniaturized. In addition, it is not necessary change the configuration of the gate electrode for optical proximity correction (OPC). Thus, it is not necessary to set a transcription margin, its yield can be improved. In addition, highly precise transcription can be implemented by employing a regular layout pattern using a super resolution technique.

Furthermore, the memory cell 10 has a plane configuration in which the word line WL in its longitudinal direction is much longer than the bit line BIT in its longitudinal direction. In addition, since there are many contacts in the SRAM as compared with a DRAM and flush memory, the cell area varies depending whether the contacts can be provided borderlessly. According to the above-described semiconductor memory device, the cell area is considerably reduced by using the LIC. For example, even if the LIC is located on an isolating region, it can get in contact without scraping an isolating oxide film formed on the isolating region.

Figure 3:
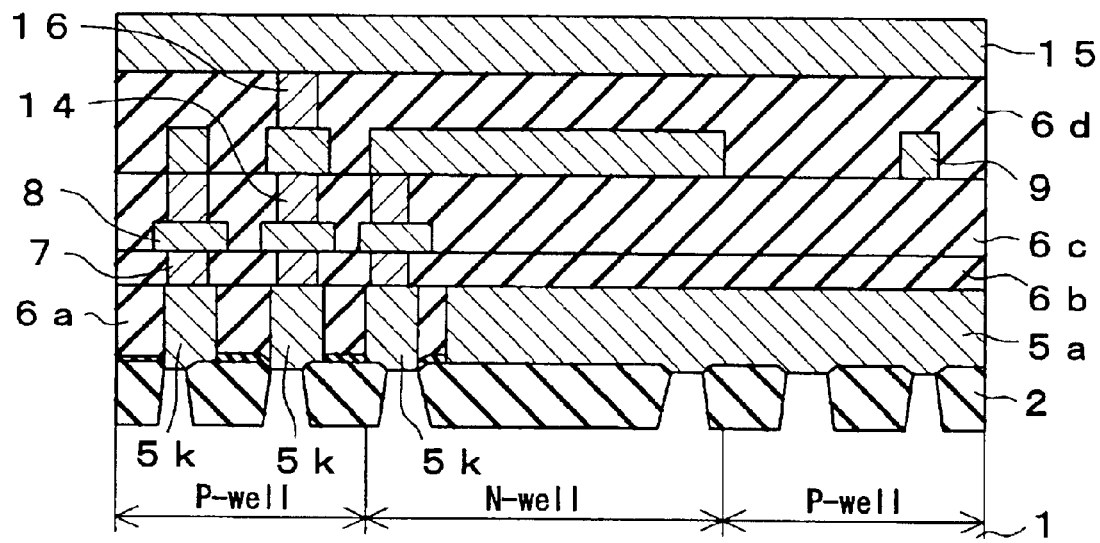
FIG. 3 is a sectional view taken along line A–A' shown in FIG. 1.
Figure 4:
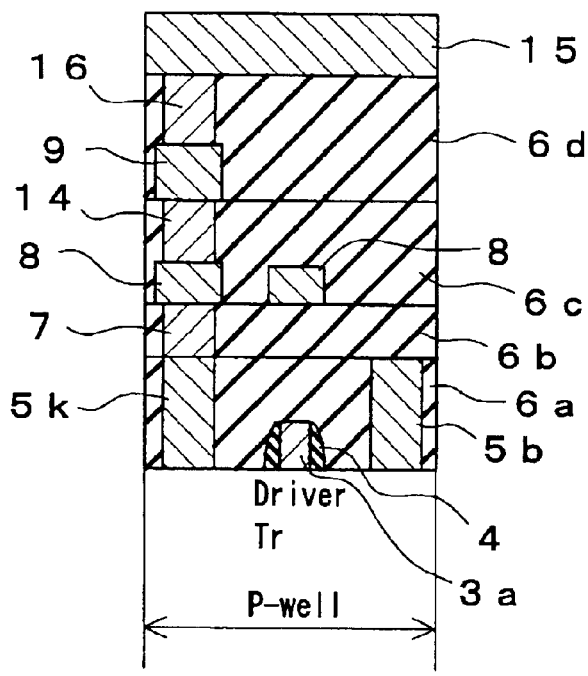
FIG. 4 is a sectional view taken along line B–B' shown in FIG. 1.
Figure 5:
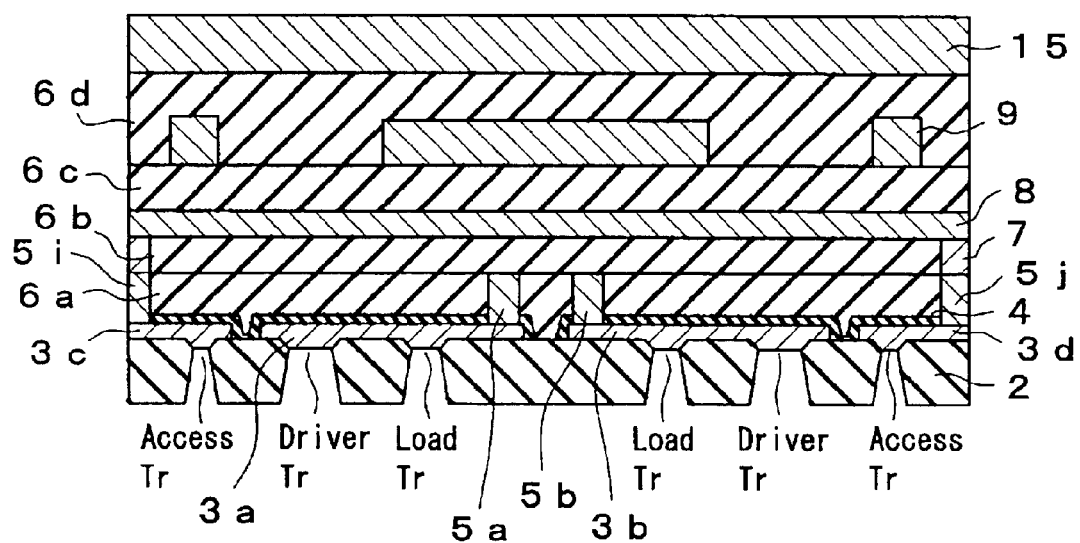
FIG. 5 is a sectional view taken along line C–C' shown in FIG. 1.
Figure 6:
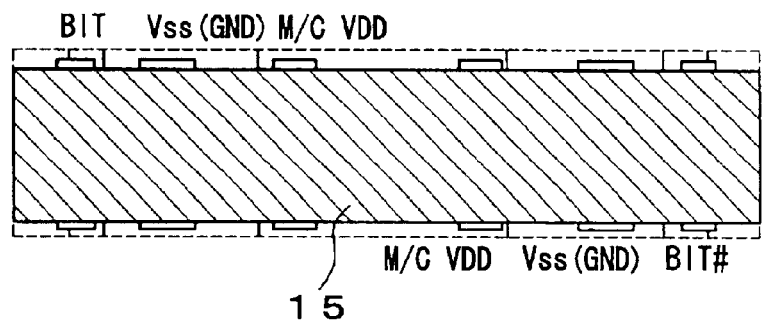
FIG. 6 is a plane view of a ground surface formed on the uppermost surface of the memory cell of the semiconductor memory device according to the first embodiment of the present invention.

Furthermore, a structure of each layer provided in the direction vertical to the surface of a semiconductor substrate 1 in the semiconductor memory device will be described with reference to FIGS. 3 to 6. FIGS. 3, 4 and 5 are sectional views taken along lines A–A', B–B' and C–C' shown in FIG. 1, respectively. FIG. 6 is a plane view of an uppermost surface of the semiconductor memory device.

(a) First, a P-well region, an N-well region and P-well region are formed on the semiconductor substrate 1 in the semiconductor memory device along the word line in the longitudinal direction (hereinafter referred to as "first direction") in this order as shown in the sectional view in FIG. 3. In addition, the access transistor 13, the load transistor 12 and the driver transistor 11 are formed with isolated from each other by element isolating oxide films (STI).

(b) Then, the first and second gate electrodes 3a and 3b formed of polysilicon for connecting the driver transistor 11 to the load transistor 12 extend in the same straight line parallel with the first direction. Furthermore, the third and fourth gate electrodes 3c and 3d formed of polysilicon are provided on the access transistor 13 and extend along the same straight line as that of the first and second gate electrodes 3a and 3b.

(c) As shown in FIG. 5, the first and second gate electrodes 3a and 3b are in contact through the first and second local inter-connectors (LIC's) 5a and 5b which are formed of tungsten and buried by damascene process in trenches for the local inter-connectors provided in an interlayer insulating film 6a deposited thereon.

(d) Then, as shown in FIG. 4, LIC's 5k and 5l are connected to a first metal layer 8 through a stack via hole.

(e) Furthermore, as shown in FIG. 5, when the gate electrodes 3a and 3b are connected to the LIC's 5a and 5b, respectively, even if mask misalignment occurs, the misalignment is allowable so long as it is within a width of a sidewall.

In addition, a cross couple interconnecting of an inverter in the memory cell is provided using the LIC. The word line WL is formed of a first metal. The bit line BIT and a VDD line are formed of a second metal. In addition, a GND is formed of a third metal.

Furthermore, each length, width or the like of the gate electrodes 3a, 3b, 3c and 3d may be substantially the same and an each interval between the gate electrodes may be the same. In this case, the interval to be buried between layers is uniform. Thus, not only a BPSG film which has a good flowability but also an NSG film, a PSG film or the like which has a small flowability can be used as an interlayer insulating film. Therefore, the degree of freedom of material selection can be improved and costs can be reduced. In addition, the material for the interlayer insulating film can be selected in accordance with processing difficulty of the CMP, dielectric constant to be set, difficulty of void generation, soft error or the like.

Furthermore, a ground surface 15 serving as a ground GND of the memory array is formed on the uppermost surface of the semiconductor memory device. Since the ground surface 15 is provided on the uppermost surface, a film thickness an be increased and a large area can be provided, whereby grounding can be implemented by a low-resistance interconnecting and a ground potential is stabilized. As a result, even in a hard sequence in which writing and reading are frequently performed, floating or noise of the GND can be tolerated and access time is improved.

Then, a manufacturing method of the semiconductor memory device will be described with reference to FIGS. 7 to 10. The semiconductor memory device is manufactured according to the following steps.

Figure 7:
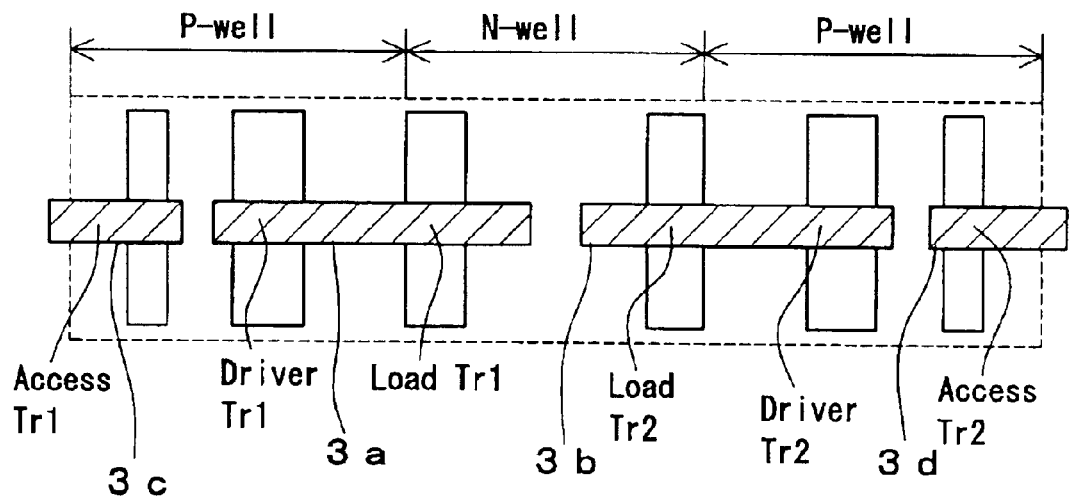
FIG. 7 is a plane view of steps of forming gate electrodes according to a manufacturing method of the semiconductor memory device according to the first embodiment of the present invention.
Figure 8:
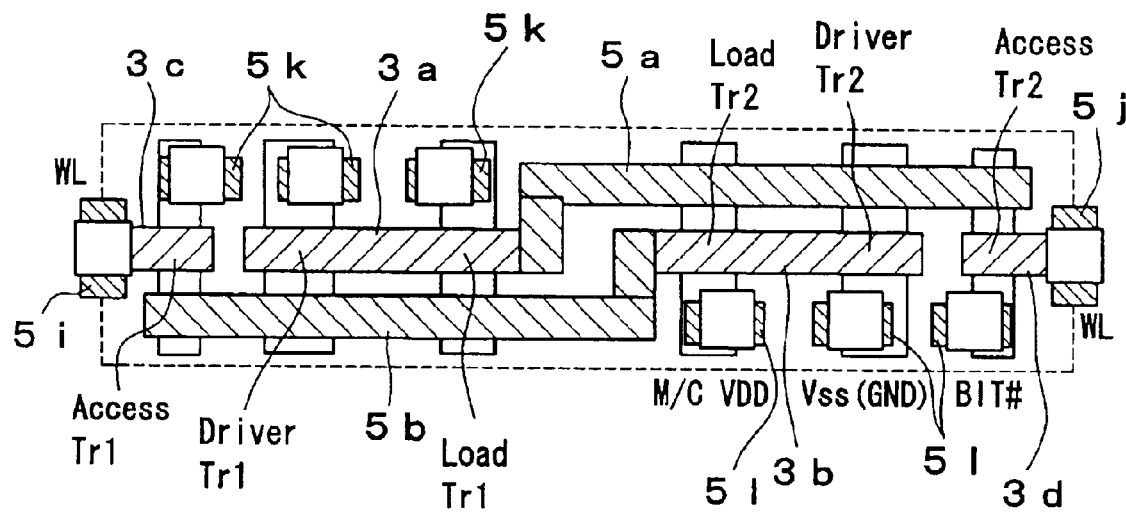
FIG. 8 is a plane view of steps of forming stack via holes for connection in a formed LIC according to the manufacturing method of the semiconductor memory device according to the first embodiment of the present invention.
Figure 9:
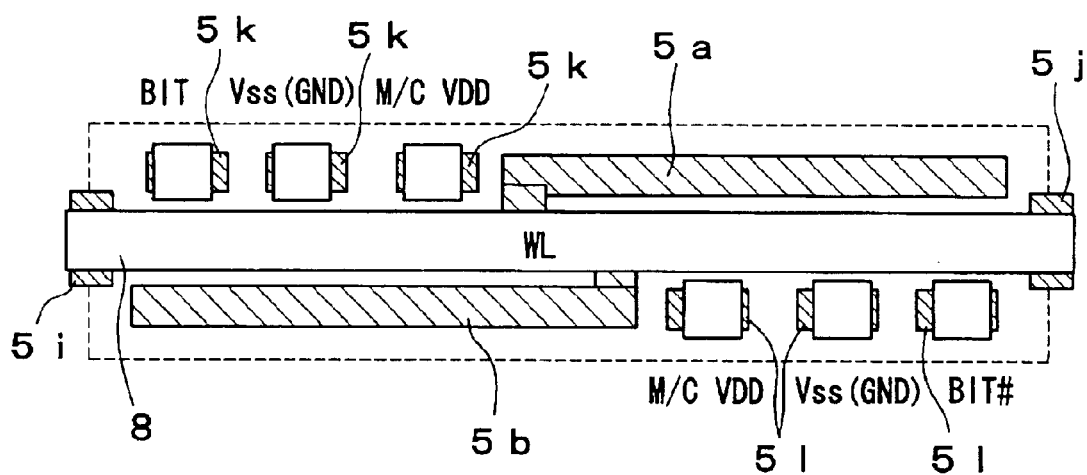
FIG. 9 is a plane view of steps of burying tungsten in a first via hole and etching away tungsten except for the hole according to the manufacturing method of the semiconductor memory device according to the first embodiment of the present invention.
Figure 10:
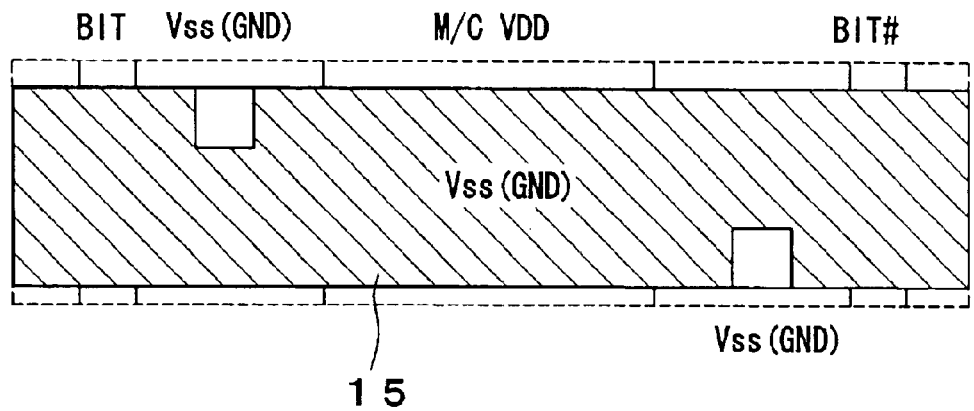
FIG. 10 is a plane view of steps depositing and etching away a third metal layer according to the manufacturing method of the semiconductor memory device according to the first embodiment of the present invention.

(1) A semiconductor substrate 1 is prepared.
(2) An oxide film 2 for isolating elements such as shallow trench isolation (STI) is formed at a predetermined position on the semiconductor substrate 1.
(3) Well regions are formed by implanting ions at predetermined positions of the substrate 1. In this case, as shown in FIG. 7, the P-well region, the N-well region and the P-well regions are formed on the semiconductor substrate 1 so as to be arranged in this order. In addition, this arranged direction is called a first direction. The first direction is the longitudinal direction of the memory cell 10.
(4) After a gate oxide film is deposited on the semiconductor substrate 1, a poly-silicon layer 3 to be the gate electrode is deposited on the gate oxide film.
(5) Six transistors 11a, 11b, 12a, 12b, 13a and 13b are formed on the semiconductor substrate 1 by ion implantation. The six transistors can be divided in two sets, e.g. first and second sets, such that each set has a driver transistor, a load transistor, and an access transistor. Then, the first set includes a driver transistor 11a, a load transistor 12a, and an access transistor 13a, and the second set includes a driver transistor 11b, a load transistor 12b, and an access transistor 13b.
(6) Then, the polysilicon layer is patterned to form the first, second, third and fourth gate electrodes 3a, 3b, 3c and 3d, as shown in FIG. 7. Here, the driver transistor 11a and the load transistor 12a of the first set are linearly connected by the first gate electrode 3a. Also, the driver transistor 11b and the load transistor 12b of the second set are linearly connected along the first direction by the second gate electrode 3b. The third gate electrode 3c is connected to the access transistor 13a. The fourth gate electrode 3d is connected to the access transistor 13b. Each of the gate electrodes 3 has rectangular configurations having sides of straight lines with no notched portion nor projection and regularly arranged. Therefore, during patterning, precision of the miniaturization can be improved. Furthermore, as shown in FIG. 7, since the four gate electrodes 3a, 3b, 3c and 3d are arranged on almost the same straight line, the length of the bit line direction in the memory cell can be reduced. Still further, since the gate electrode can be linearly laid out like a metal, even when a problem with respect to an electrical characteristic arises because of an interval ratio between the transistors, the characteristic can be improved by changing the layout.
(7) A sidewall 4 is formed on side of the gate electrode 3.
(8) A source region S and a drain region D are formed under the semiconductor substrate by ion implantation.
(9) A $CoSi_2$ layer is formed on the semiconductor substrate.
(10) An etching stopper film is deposited on the $CoSi_2$ layer.
(11) A insulating film 6a is deposited on the etching stopper film. The insulating film 6a is planarized.
(12) The planarized insulating film 6a is etched away using a mask for the local-inter connector (LIC). At this time, the etching is stopped by the etching stopper film.
(13) The etching stopper film which is exposed by etching of the planarized insulating film 6a is removed to provide a trench for the LIC.
(14) Then, tungsten (W) is deposited in the trench for LIC and flattened to leave the tungsten only in the trench (that is W (tungsten) damascene process) to form tungsten LIC's 5a, 5b, 5i, 5j, 5k and 5l. The gate electrodes can be in contact through the LIC's 5a, 5b, 5i and 5j. Thus, it is not necessary to change the configuration of the gate electrodes to provide a margin for a contact. In addition, the LIC's 5a and 5b can be formed by single damascene process for only connecting. An active region of the driver transistor 11b of the second set and an active region of the load transistor 12b of the second set are connected to the first gate electrode 3a by the LIC 5a. An active region of the driver transistor 11a of the first set and an active region of the load transistor 12a of the first set are connected to the second gate electrode 3b by the LIC 5b. The LIC 5a is corresponding to a first connector, and LIC 5b is corresponding to a second connector. The third gate electrodes 3c and the fourth gate electrode 3d are respectively connected to word line WL by the LIC's 5i, and 5j. The LIC 5i is corresponding to a third connector, and the LIC 5j is corresponding to fourth connector.
(15) A insulating film 6b is formed on the insulating film 6a. The insulating film 6b is planarized.
(16) A hole for a stack via hole 7 is formed through the insulating films 6a and 6b.
(17) Tungsten other than that in the tungsten LIC 5 and in the stack via hole 7 is removed, as shown in FIG. 8. Then, the stack via hole 7 for connecting the word line WL through the LIC's 5i and 5j can be formed.
(18) The first method layer 8 is deposited on the whole surface of the insulating film 6b.
(19) A first metal layer 8 is removed by using a mask for the first metal except for a predetermined position, whereby the word line WL formed of the first metal 8 can be formed as shown in FIG. 10.
(20) An interlayer insulating film 6c is deposited on the insulating film 6b and the first metal layer 8.
(21) A first via hole 14 is formed through the insulating film 6c.
(22) Tungsten is buried in the first via hole 14 and then, it is removed by etching except for that part as shown in FIG. 9, whereby electrical connection from the first metal 8 to the upper layer can be implemented.
(23) A second metal layer 9 is deposited on the insulating film 6c and removed except for predetermined positions, whereby the bit line and the VDD line are formed.
(24) An interlayer insulating film 6d is deposited on the insulating film 6c and the second metal layer 9.
(25) A second via hole 16 is formed through the insulating film 6d by etching.
(26) Tungsten W is buried in the second via hole 16 and tungsten other than that is removed by etching.

(27) A third metal layer 15 is deposited over the insulating film 6d and removed except for the predetermined positions as shown in FIG. 10. The third metal layer 15 serves as the ground GND of the whole memory cell array. Since the ground surface is provided on the uppermost surface of the laminated structure, the ground surface which is almost the same as large as the memory cell can be provided. In addition, since the film thickness can be increased, a ground potential becomes stable.

Thus, the semiconductor memory device can be provided according to the above-steps. According to the manufacturing method of the semiconductor memory device, the gate electrodes in the single memory cell can be arranged almost on the same straight line and the length in the bit line direction can be reduced, whereby a signal level of data on the bit line can be prevented from deteriorating.

Meanwhile, according to the manufacturing method of the semiconductor memory device, there can be provided the semiconductor memory device including the gate electrodes 3a, 3b, 3c and 3d arranged on the same straight line parallel to the word line. As a result, the length of the bit line vertical to the word line can be reduced and the signal level on the bit line can be prevented from lowering. In addition, there can be provided the semiconductor memory device including the gate electrode 3 with the rectangular configuration having sides of straight lines with no notched portion nor projection. As a result, the transistor characteristics of the transistors such as driver transistor 11, the load transistor 12 and the access transistor 13 which constitute the semiconductor memory device becomes stable and uniform. Consequently, stable characteristics as the semiconductor memory device can be provided.

(Embodiment 2)

Figure 11:
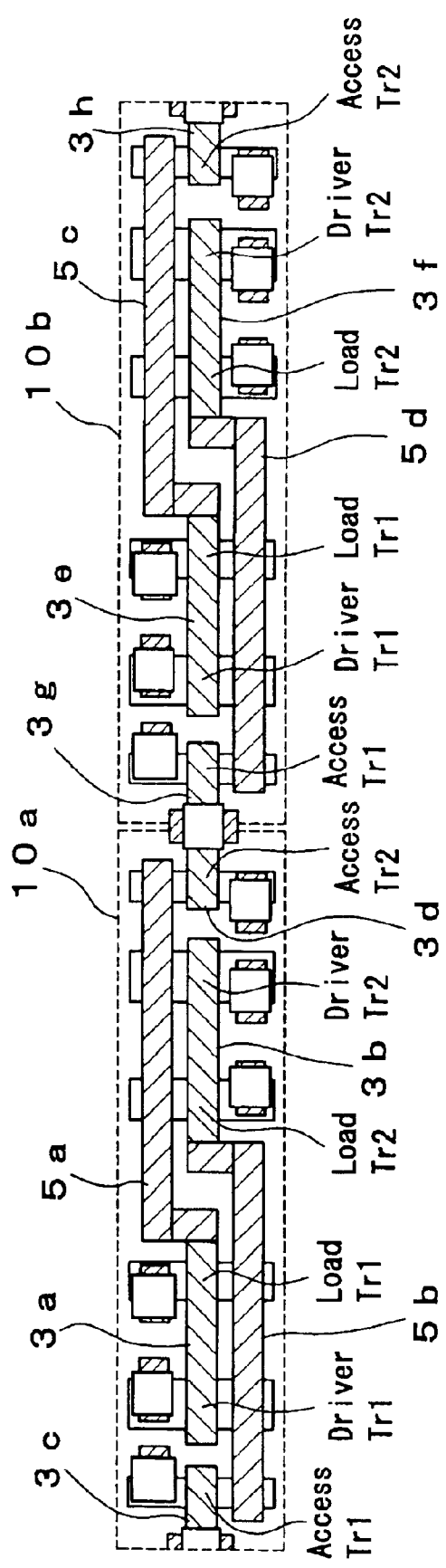
FIG. 11 is a plane view of an arrangement of gate electrodes in two memory cells of a semiconductor memory device according to a second embodiment of the present invention.

A semiconductor memory device according to an embodiment 2 of the present invention will be described with reference to FIG. 11. FIG. 11 is a plane view of an arrangement of the gate electrodes in two memory cells 10a and 10b. According to this semiconductor memory device, all of the gate electrodes 3a, 3b, 3c, 3d, 3e, 3f, 3g and 3h connected to each transistor in the two memory cells 10a and 10b which are juxtaposed along the longitudinal direction of a word line are arranged on the same straight line. Thus, a bit line length can be reduced as the whole of the memory cell and the word line can be straight without snaking its way along each of the memory cells. Thus, a signal level on the bit line can be prevented from lowering and the arrangement of the word line can be simple. Furthermore, the gate electrode has a rectangular configuration constituted by sides of straight lines. As a result, the gate electrode can be laid out easily and further miniaturized.

Furthermore, in this case, each of the memory cells 10a and 10b is a recurring unit and has the same structure of the gate electrode 3. However, it is all right so long as all of the gate electrodes of the two memory cells juxtaposed to each other are arranged in the longitudinal direction of the word line and the recurring unit of each memory cell does not necessarily coincide with that of the whole. For example, two memory cells 10a and 10b may be a recurring unit. In this case, the memory cells 10a and 10b may be axisymmetric about a borderline. Furthermore, a recurring unit is constituted of two or more memorial cells.

(Embodiment 3)

Figure 12:
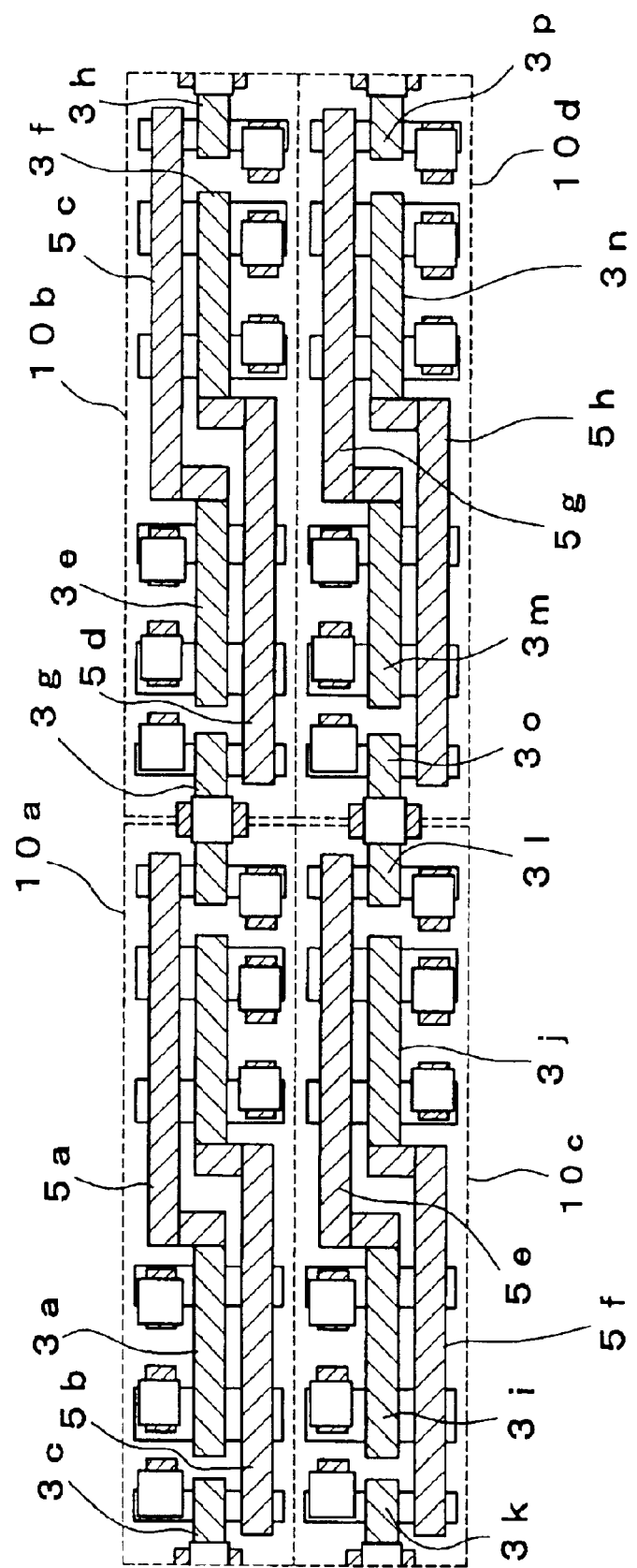
FIG. 12 is a plane view of an arrangement of gate electrodes in four memory cells in a first example of the semiconductor memory device according to the second embodiment of the present invention.
Figure 13:
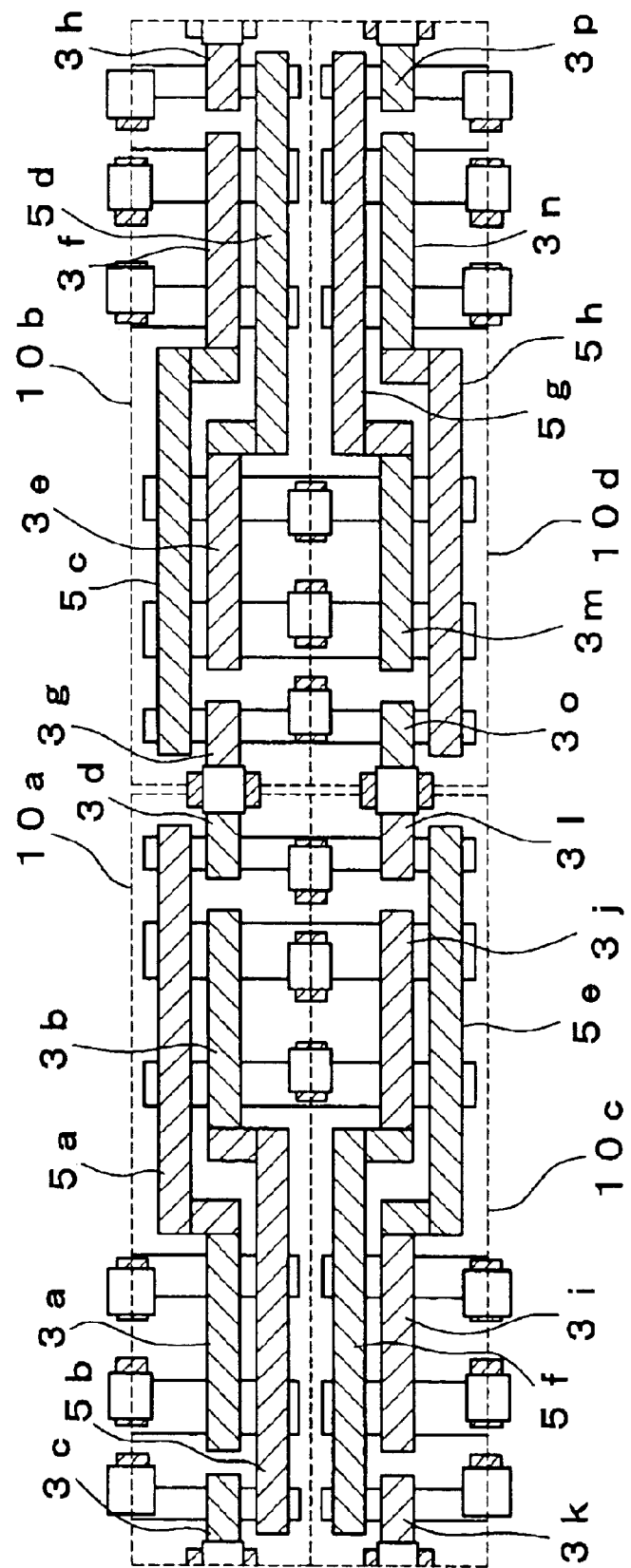
FIG. 13 is a plane view of an arrangement of gate electrodes in four memory cells in a second example of the semiconductor memory device according to the second embodiment of the present invention.

A semiconductor memory device according to an embodiment 3 of the present invention will be described with reference to FIGS. 12 and 13. FIG. 12 is a plane view of an arrangement of gate electrodes of four memory cells 10a, 10b, 10c and 10d. FIG. 13 is a plane view of another arrangement of gate electrodes in consideration of the symmetric property of each memory cell. According to the semiconductor memory device in the first example, as shown in FIG. 12, a memory cell array is provided in such a manner that one memory cell is a recurring unit. In this case, the gate electrodes of the four memory cells 10a, 10b, 10c and 10d have the same structure.

According to the semiconductor memory device in the second example, as shown in FIG. 13, four memory cells are constituted as one recurring unit. More specifically, the memory cells 10a and 10b are mirror symmetric with each other according to the structure of the gate electrode. In addition, the memory cells 10a and 10c are also mirror symmetric with each other. Therefore, the memory cells 10a and 10d have the same structure of the gate electrodes and the memory cells 10b and 10c have the same structure of the gates. In this case, as shown in FIG. 13, it is not necessary to individually provide contacts between memory cells and they are shared, thereby increasing the degree of allowance of the gate electrodes. Furthermore, the recurring unit is not limited to the above case and there may be provided a recurring unit including a plurality of memory cells by appropriately selecting the structure of the gate electrodes.

According to the semiconductor memory device of the present invention, all of the gate electrodes in the single memory cell are arranged on the same straight line parallel to the longitudinal direction of the word line. Thus, the length in the direction of the bit line vertical to the word line can be reduced in one memory cell. As a result, wiring capacitance and wiring resistance of the bit line can be reduced and then reading and writing speed is increased. Especially, in reading, a memory cell current can be considerably increased and a circuit structure of a sense amplifier system can corresponds to high speed. Meanwhile, the signal level on the bit line can be prevented from lowering.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A semiconductor memory device comprising:
   a memory cell array in which memory cells each having six transistors are arranged two-dimensionally on a semiconductor substrate;
   a plurality of word lines connected to each of the memory cells, and arranged on a parallel to each other along a first direction;
   a plurality of bit lines connected to each of the memory cells and arranged on a parallel to each other along a second direction perpendicular to the first direction; and
   at least two gate electrodes provided on the semiconductor substrate such that each of the gate electrodes is connected to at least one transistor of the six transistors, all of the gate electrodes being arranged on the same straight line parallel to the first direction.

2. A semiconductor memory device according to claim 1, wherein all gate electrodes in two memory cells adjacent to each other in the first direction are arranged on the substantially same straight line.

3. A semiconductor memory device according to claim 1, wherein each of the gate electrodes has a rectangular configuration having sides of straight line.

4. A semiconductor memory device according to claim 1, wherein the semiconductor memory device has a laminated structure in which layers are laminated on the semiconductor substrate and a ground surface serving as a ground of each memory cell is formed on the uppermost surface of the laminated structure.

5. A semiconductor memory device according to claim 1, wherein the six transistors comprises first and second sets of driver transistor, load transistor and access transistor, and the gate electrodes comprises:

a first gate electrode connecting the driver transistor and the load transistor of the first set;

a second gate electrode connecting the driver transistor and load transistor of the second set;

a third gate electrode connected to the access transistor of the first set; and a fourth gate electrode connected to the access transistor of the second set, wherein the third electrode, the first electrode, the second electrode, and the fourth electrode are respectively arranged from the one end of the straight line to the other end of the straight line.

6. A semiconductor memory device according to claim 5, further comprising:

a first connector connecting first gate electrode to an active region of the driver transistor of the second set and an active region of the load transistor of the second set;

a second connector connecting first gate electrode to active region of the driver transistor of the first set and an active region of the load transistor of the first set;

a third connector connecting the third gate electrode and the word line; and a fourth connector connecting the fourth gate electrode and the word line, wherein the first and second connectors respectively include parts which are parallel to the all of the gate electrodes.

* * * * *